United States Patent
Jin et al.

(10) Patent No.: US 7,351,627 B2
(45) Date of Patent: Apr. 1, 2008

(54) METHOD OF MANUFACTURING SEMICONDUCTOR DEVICE USING GATE-THROUGH ION IMPLANTATION

(75) Inventors: Seung Woo Jin, Icheon-shi (KR); Min Yong Lee, Seoul (KR); Kyoung Bong Rouh, Goyang-si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 155 days.

(21) Appl. No.: 11/272,542

(22) Filed: Nov. 10, 2005

(65) Prior Publication Data
US 2007/0004159 A1 Jan. 4, 2007

(30) Foreign Application Priority Data
Jun. 29, 2005 (KR) .................. 10-2005-0057365

(51) Int. Cl.
H01L 21/336 (2006.01)
H01L 21/8234 (2006.01)
H01L 21/8238 (2006.01)

(52) U.S. Cl. .................. 438/197; 438/217; 438/227; 438/231; 438/286; 438/301; 438/302; 438/305; 257/E21.342; 257/E21.345; 257/E21.427

(58) Field of Classification Search .............. 438/197, 438/217, 227, 231, 301, 302, 305; 257/E21.335, 257/E21.336, E21.345
See application file for complete search history.

(56) References Cited

U.S. PATENT DOCUMENTS

| 5,607,868 | A | * | 3/1997 | Chida et al. ............ 438/258 |
| 5,925,914 | A | * | 7/1999 | Jiang et al. ............ 257/344 |
| 5,960,291 | A | * | 9/1999 | Krivokapic ............ 438/286 |
| 6,187,643 | B1 | | 2/2001 | Borland ............ 438/302 |
| 6,221,703 | B1 | | 4/2001 | Liu et al. ............ 438/174 |
| 6,248,619 | B1 | * | 6/2001 | Lee et al. ............ 438/200 |
| 6,255,700 | B1 | * | 7/2001 | Yoshida et al. ............ 257/380 |
| 6,368,947 | B1 | * | 4/2002 | Yu ............ 438/530 |
| 6,498,080 | B1 | * | 12/2002 | Chittipeddi et al. ............ 438/585 |
| 6,596,594 | B1 | * | 7/2003 | Guo ............ 438/279 |
| 7,214,575 | B2 | * | 5/2007 | Rhodes ............ 438/197 |

FOREIGN PATENT DOCUMENTS

JP 05-102067 4/1993

* cited by examiner

*Primary Examiner*—Michael Lebentritt
*Assistant Examiner*—Mohsen Ahmadi
(74) *Attorney, Agent, or Firm*—Marshall, Gerstein & Borun LLP

(57) ABSTRACT

Disclosed herein is a method of manufacturing a semiconductor device via gate-through ion implantation, comprising forming a gate stack on a semiconductor substrate and performing ion implantation for control of the threshold voltage and junction ion implantation for formation of source/drain regions, on the entire surface of the semiconductor substrate having the gate stack formed thereon. In accordance with the present invention, since ion implantation is carried out after formation of the gate stack involving a thermal process, there are no changes in concentrations of implanted dopants due to heat treatment upon formation of the gate stack.

5 Claims, 5 Drawing Sheets

METHOD OF MANUFACTURING SEMICONDUCTOR DEVICE USING GATE-THROUGH ION IMPLANTATION

BACKGROUND OF THE INVENTION

1. Field of the Invention

The present invention relates to a method of manufacturing a semiconductor device, and more particularly to a method of manufacturing a semiconductor device via gate-through ion implantation.

2. Description of the Related Art

FIG. 1 is a flow chart illustrating a conventional method of manufacturing a semiconductor device. FIGS. 2 and 3 are cross-sectional views illustrating partial steps of a method of manufacturing a semiconductor device of FIG. 1.

Referring now to FIG. 1 in conjunction with FIGS. 2 and 3, isolation films 210 defining an active region 220 of a semiconductor substrate 200 are first formed (Step 110). Next, as represented by arrows in FIG. 2, ion implantation for well regions and channel region is carried out, utilizing a cell-open mask (Step 120). Then, ion implantation for the well regions and channel region is carried out, utilizing an NMOS-open mask (Step 130). Next, ion implantation for the well regions and channel region is carried out, utilizing a PMOS-open mask (Step 140).

Next, a gate stack 240 including gate insulating film patterns 241 and gate conductive film patterns 242 sequentially stacked thereon is formed on the channel region 230. Then, gate spacers 250 are formed on side faces of the gate stack 240 (Step 150). Next, as represented by arrows in FIG. 3, junction ion implantation is carried out, utilizing a cell-open mask (Step 160). Consequently, source/drain regions 260 are formed within the cell regions. Next, junction ion implantation for an NMOS region of a peripheral circuit region is carried out, utilizing an NMOS-open mask (Step 170). Next, junction ion implantation for a PMOS region of a peripheral circuit region is carried out, utilizing a PMOS-open mask (Step 180).

However, the recently increased degree of integration of semiconductor devices leads to sharp shortening in a channel length of MOS transistors constituting the semiconductor devices. With such a shortened channel length of MOS transistors, short-channel effects (SCF) serve as a primary cause deteriorating properties and performance of devices. In particular, short-channel effects result in deterioration of leakage current characteristics in the off-state of the devices. As a method to solve such problems, a dopant concentration of a channel may be increased. However, increased dopant concentration of the channel may augment hot carrier effects, thereby deteriorating reliability of the devices. As such, a suitable concentration of dopant ions should be implanted, but the concentration of implanted dopants is significantly affected by a subsequent thermal process. In particular, implanted dopants are diffused by the thermal process until formation of the source/drain regions 260 after forming the gate stack 240, thus resulting in decreased concentration thereof, and consequently, short-channel effects become more severe. In order to alleviate such problems, halo ion implantation is conventionally employed during formation of junctions, but suffers from disadvantages such as increased numbers of masks and process steps, thus resulting in complicated manufacturing processes of semiconductor devices.

SUMMARY OF THE INVENTION

Therefore, the present invention has been made in view of the above problems, and it is an object of the present invention to provide a method of manufacturing a semiconductor device, which is capable of preventing occurrence of problems caused by the effects of subsequent thermal processes on dopants implanted into a semiconductor substrate.

In accordance with an aspect of the present invention, the above and other objects can be accomplished by the provision of a method of manufacturing a semiconductor device via gate-through ion implantation, comprising:

forming a gate stack on a semiconductor substrate; and performing ion implantation for control of threshold voltage and junction ion implantation for formation of source/drain regions, on the entire surface of the semiconductor substrate having the gate stack formed thereon.

The above-mentioned method may further include forming gate spacers on side walls of the gate stack after formation of the gate stack.

Herein, ion implantation for formation of source/drain regions may be carried out after formation of the gate spacers.

Ion implantation for control of threshold voltage and junction ion implantation may be carried out at a tilt angle of 0 to 20 degrees, an implantation energy of 5 to 2000 KeV and a dose of $1.1 \times 10^{11}$ to $1.0 \times 10^{16}$ ions/cm$^2$.

In accordance with another aspect of the present invention, there is provided a method of manufacturing a semiconductor device, comprising:

forming a gate stack on a semiconductor substrate;

performing ion implantation for formation of wells, ion implantation for control of threshold voltage and junction ion implantation for formation of source/drain regions, in cell regions, utilizing a cell-open mask, on the entire surface of the semiconductor substrate having the gate stack formed thereon;

performing ion implantation for formation of wells, ion implantation for control of threshold voltage and junction ion implantation for formation of source/drain regions, in an NMOS region of a peripheral circuit region, utilizing an NMOS-open mask, on the entire surface of the semiconductor substrate having the gate stack formed thereon; and performing ion implantation for formation of wells, ion implantation for control of threshold voltage and junction ion implantation for formation of source/drain regions, in a PMOS region of the peripheral circuit region, utilizing a PMOS-open mask, on the entire surface of the semiconductor substrate having the gate stack formed thereon.

The above-mentioned method may further include forming gate spacers on the side walls of the gate stack after formation thereof.

Herein, ion implantation for formation of wells, ion implantation for control of threshold voltage and junction ion implantation in the cell regions, ion implantation for formation of wells, ion implantation for control of threshold voltage and junction ion implantation in the NMOS region, and ion implantation for formation of wells, ion implantation for control of threshold voltage and junction ion implantation in the PMOS region may be carried out after formation of the gate spacers.

Ion implantation for formation of wells, ion implantation for control of threshold voltage and junction ion implantation, in the cell regions, NMOS region and PMOS region, may be carried out at an angle of 0 to 20 degrees, implantation energy of 5 to 2000 KeV and a dose of $1.1 \times 10^{11}$ to $1.0 \times 10^{16}$ ions/cm$^2$.

In accordance with yet another aspect of the present invention there is provided a method of manufacturing a semiconductor device, comprising:

sequentially forming a gate insulating film and a gate conductive film on a semiconductor substrate;

performing ion implantation for formation of wells and ion implantation for control of threshold voltage, on the entire surface of the semiconductor substrate having the gate insulating film and gate conductive film formed thereon;

patterning the gate insulating film and gate conductive film to form a gate stack in which gate insulating film patterns and gate conductive film patterns are sequentially stacked; and performing junction ion implantation for formation of source/drain regions, on the entire surface of the semiconductor substrate having the gate stack formed thereon.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described more fully with reference to the accompanying drawings hereinafter, in which preferred embodiments of the invention are shown. This invention may, however, be embodied in different forms and should not be construed as limited to the embodiments set forth herein.

Figure 1:
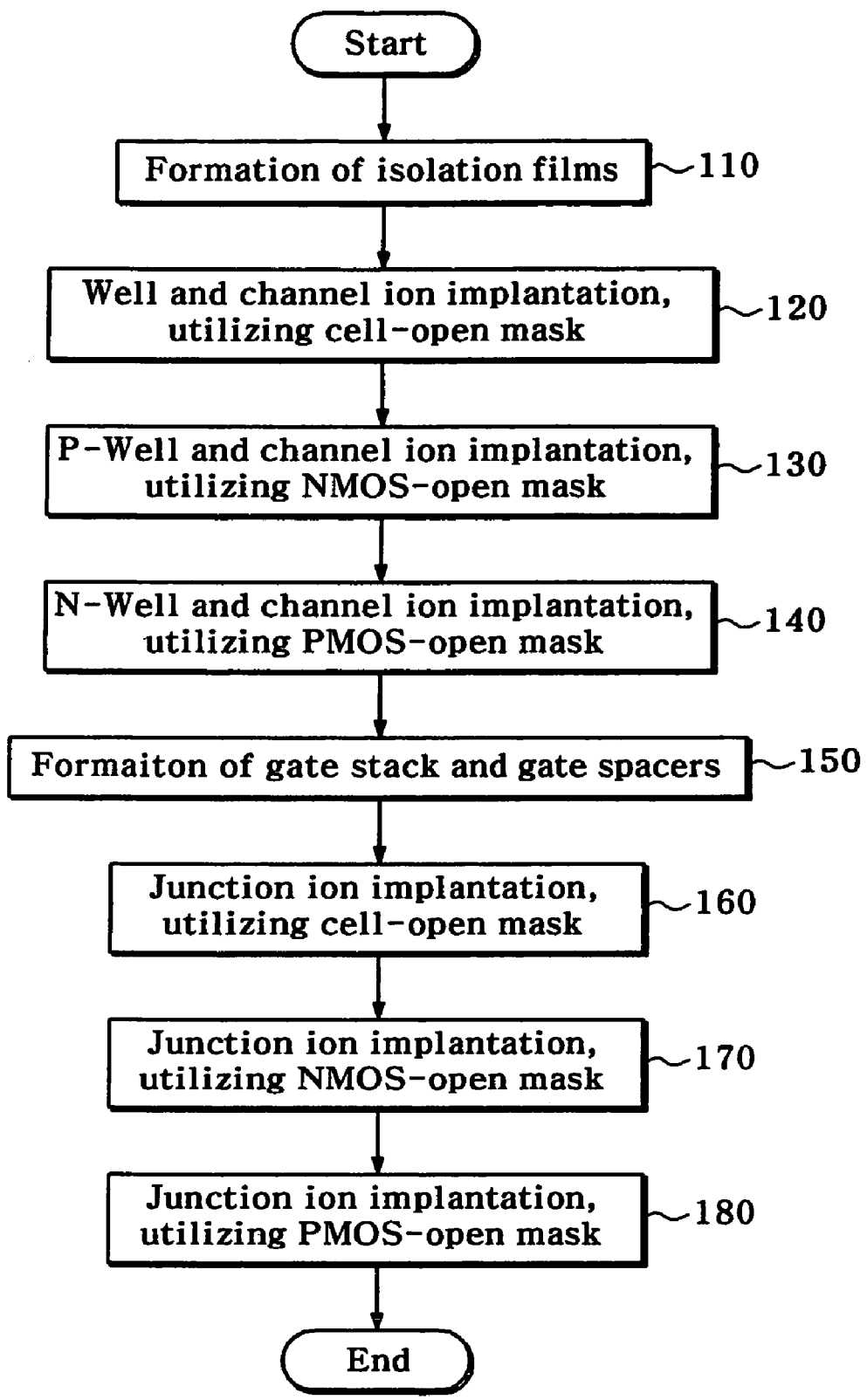
FIG. 1 is a flow chart illustrating a conventional method of manufacturing a semiconductor device.
Figure 2:
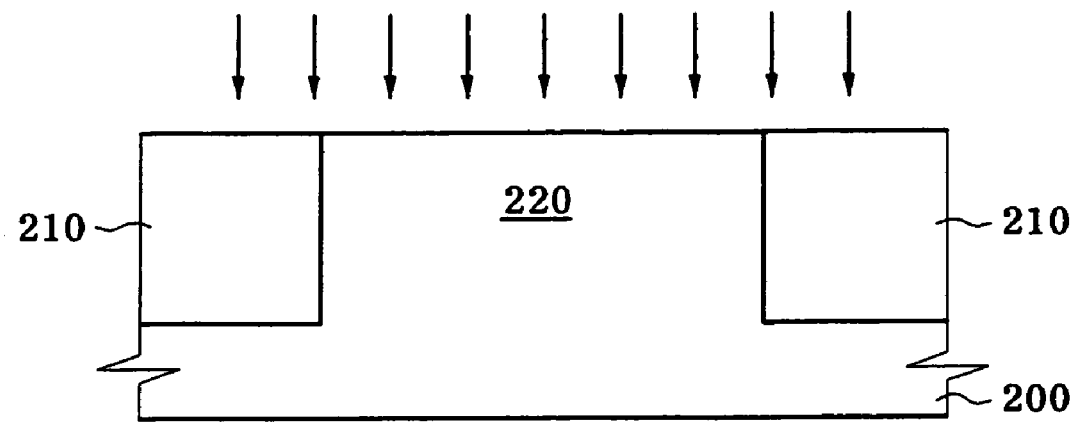
FIGS. 2 and 3 are cross-sectional views illustrating partial steps of a method of manufacturing a semiconductor device of FIG. 1.
Figure 3:
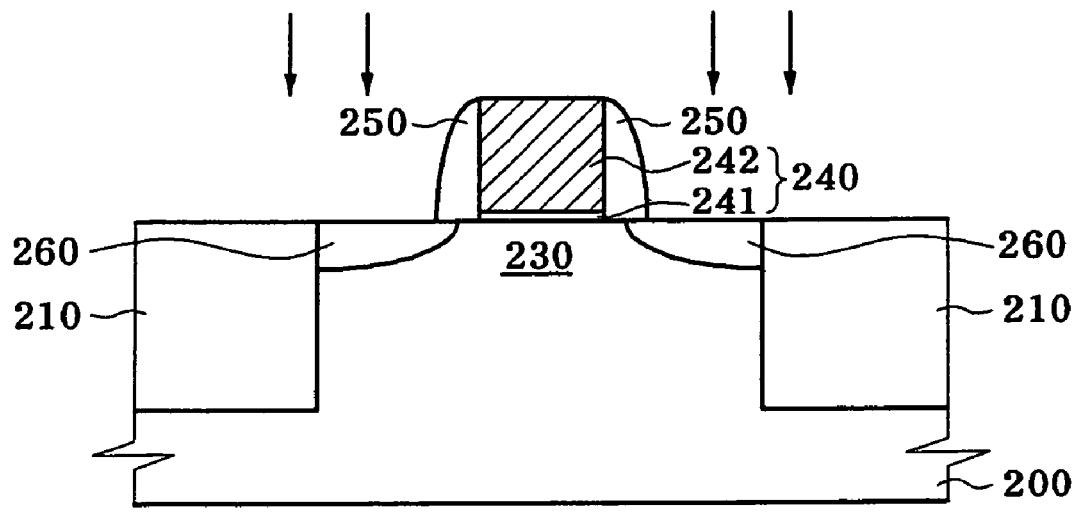
Figure 4:
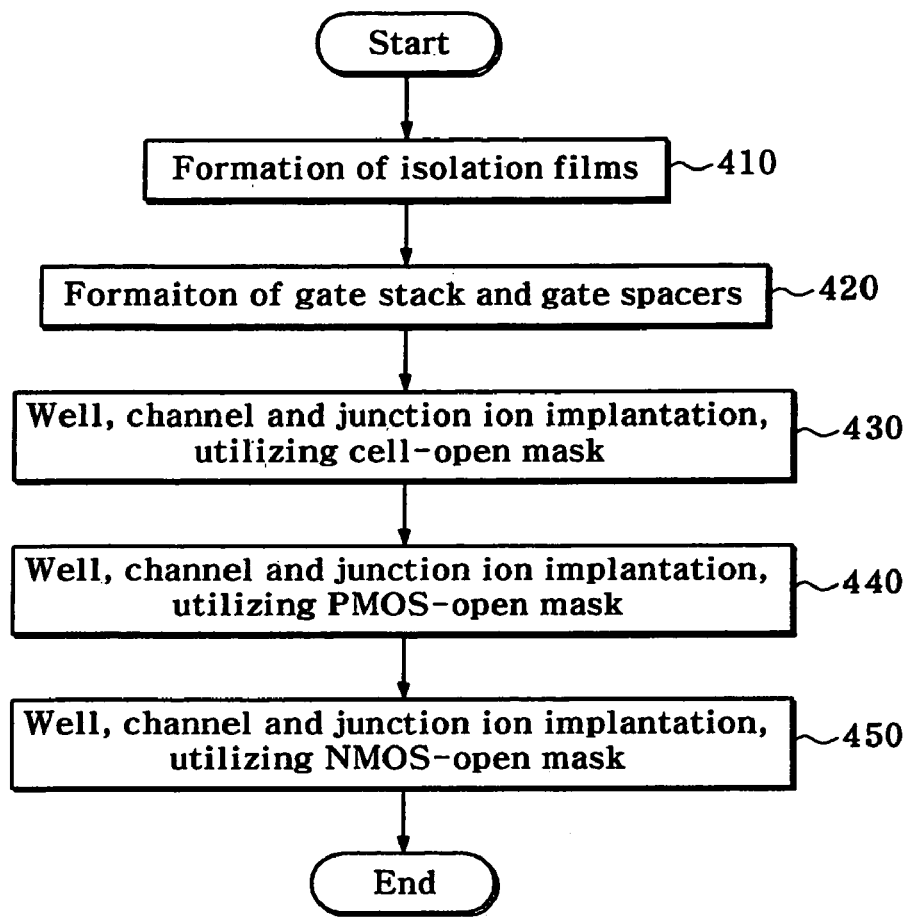
FIGS. 4 and 5 are, respectively, a flow chart and cross-sectional view illustrating a method of manufacturing a semiconductor device via use of gate-through ion implantation in accordance with one embodiment of the present invention.
Figure 5:
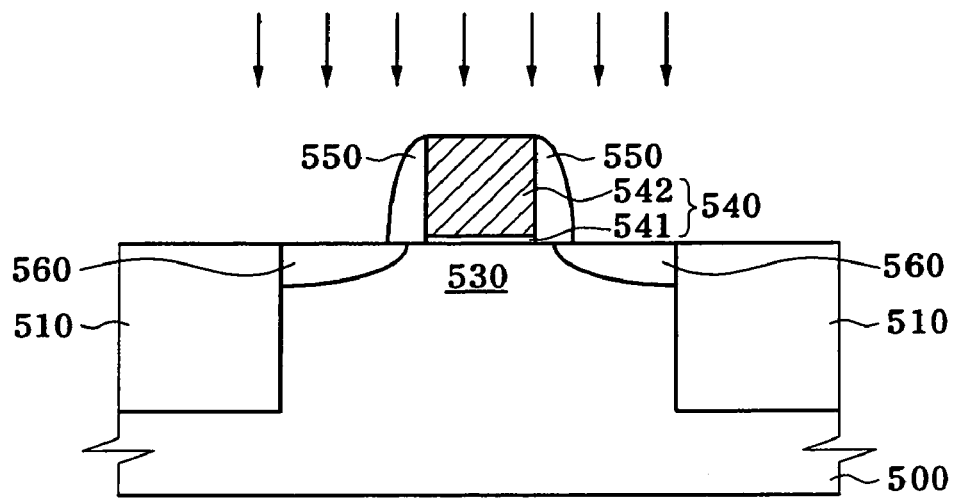

FIGS. 4 and 5 are, respectively, a flow chart and cross-sectional view illustrating a method of manufacturing a semiconductor device via gate-through ion implantation in accordance with one embodiment of the present invention.

Referring now to FIGS. 4 and 5, isolation films 510 defining an active region are first formed on a semiconductor substrate 500 (Step 410). Herein, even though the isolation films 510 are exemplified as trench isolation films, the isolation films may be Local Oxidation of Silicon (LOCOS) isolation films or any other forms, if desired. Next, a gate stack 540 is formed on a channel region 530 of the semiconductor substrate 500, and gate spacers 550 are formed on side faces of the gate stack 540 (Step 420). The gate stack 540 is formed of a structure in which gate insulating film patterns 541 and gate conductive film patterns 542 are sequentially stacked. For this purpose, a gate insulating film and a gate conductive film are first sequentially stacked.

Next, using certain mask film patterns, for example photoresist film patterns as an etch mask, etching is carried out to sequentially remove the exposed portions of the gate conductive film and gate insulating film, followed by removal of mask film patterns.

Next, as indicated by arrows in FIG. 5, ion implantation for formation of wells, ion implantation for control of threshold voltage and junction ion implantation for formation of source/drain regions 560 are continuously carried out, utilizing a cell-open mask, on the entire surface of the semiconductor substrate 500 having the gate stack 540 and gate spacers 550 formed thereon (Step 430). Ion implantation for formation of wells, ion implantation for control of threshold voltage and junction ion implantation for formation of source/drain regions 560 are carried out by gate-through implantation in which ion implantation is effected through the gate stack 540. The cell-open mask is formed using a photoresist film. If necessary, ion implantation for formation of wells and ion implantation for control of the threshold voltage may be carried out after formation of the gate stack 540, and junction ion implantation may be carried out after formation of the gate spacers 550. In either event, ion implantation for formation of wells, ion implantation for control of threshold voltage, and junction ion implantation are carried out at an angle of 0 to 20 degrees, an implantation energy of 5 to 2000 KeV and a dose of $1.1 \times 10^{11}$ to $1.0 \times 10^{16}$ ions/cm$^2$.

Next, for a PMOS region of a peripheral circuit region, ion implantation for formation of wells, ion implantation for control of threshold voltage and junction ion implantation for formation of source/drain regions are continuously carried out utilizing a PMOS-open mask (Step 440). The PMOS-open mask is formed using a photoresist film. If necessary, ion implantation for formation of wells and ion implantation for control of threshold voltage may be carried out after formation of the gate stack 540, and junction ion implantation may be carried out after formation of the gate spacers 550. Similarly, ion implantation for formation of wells, ion implantation for control of threshold voltage and junction ion implantation for formation of source/drain regions are carried out by gate-through implantation in which ion implantation is effected through the gate stack 540. Ion implantation for formation of wells, ion implantation for control of threshold voltage and junction ion implantation are carried out at an angle of 0 to 20 degrees, an implantation energy of 5 to 2000 KeV and a dose of $1.1 \times 10^{11}$ to $1.0 \times 10^{16}$ ions/cm$^2$.

Next, for an NMOS region of a peripheral circuit region, ion implantation for formation of wells, ion implantation for control of the threshold voltage and junction ion implantation for formation of source/drain regions are continuously carried out utilizing an NMOS-open mask (Step 450). The NMOS-open mask is formed using a photoresist film. If necessary, ion implantation for formation of wells and ion implantation for control of threshold voltage may be carried out after formation of the gate stack 540, and junction ion implantation may be carried out after formation of the gate spacers 550. Similarly, ion implantation for formation of wells, ion implantation for control of the threshold voltage and junction ion implantation for formation of source/drain regions are carried out by gate-through implantation in which ion implantation is affected through the gate stack 540. Ion implantation for formation of wells, ion implantation for control of threshold voltage and junction ion implantation are carried out at an angle of 0 to 20 degrees, an implantation energy of 5 to 2000 KeV and a dose of $1.1 \times 10^{11}$ to $1.0 \times 10^{16}$ ions/cm$^2$.

Figure 6:
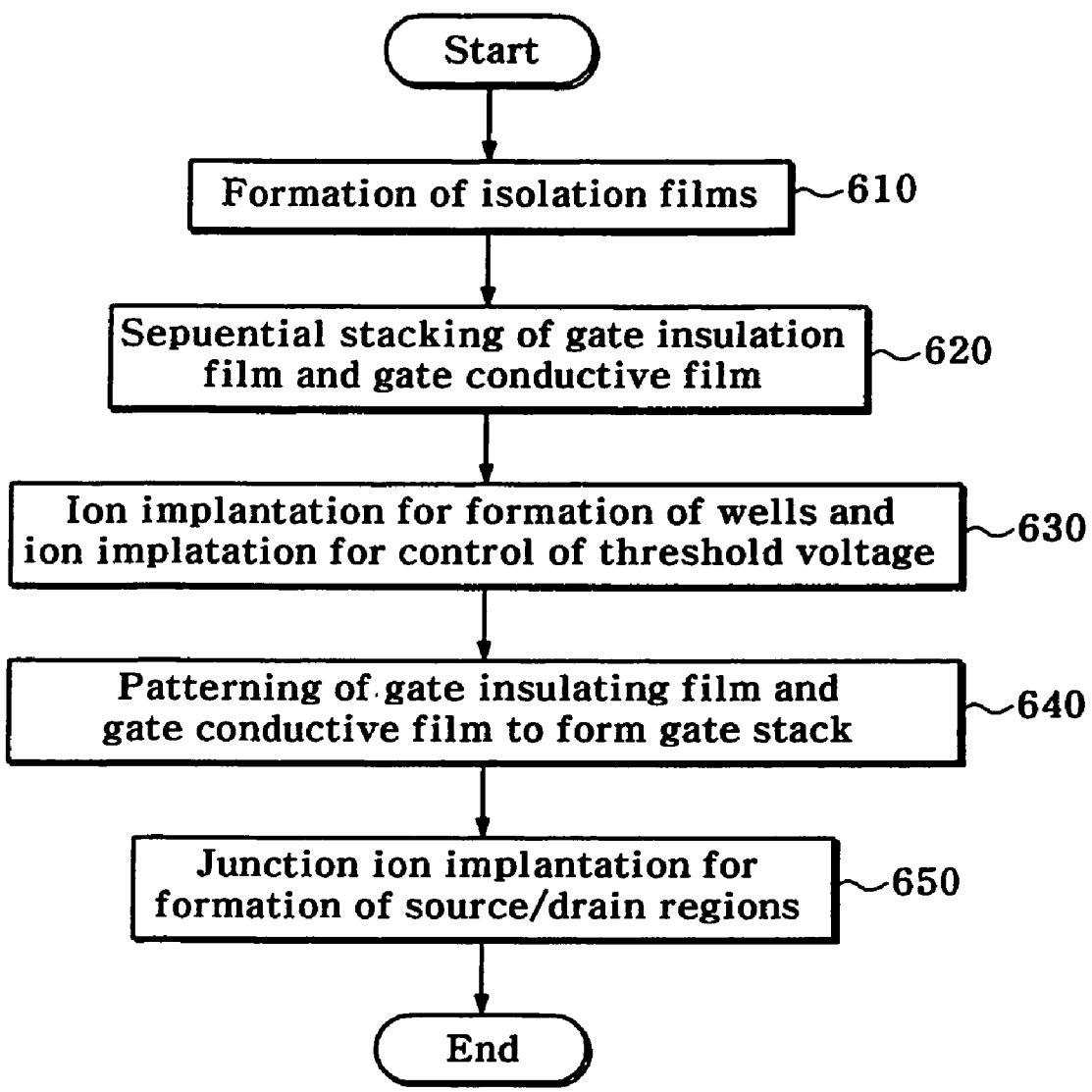
FIG. 6 is a flow chart illustrating a method of manufacturing a semiconductor device via use of gate-through ion implantation in accordance with another embodiment of the present invention.
Figure 7:
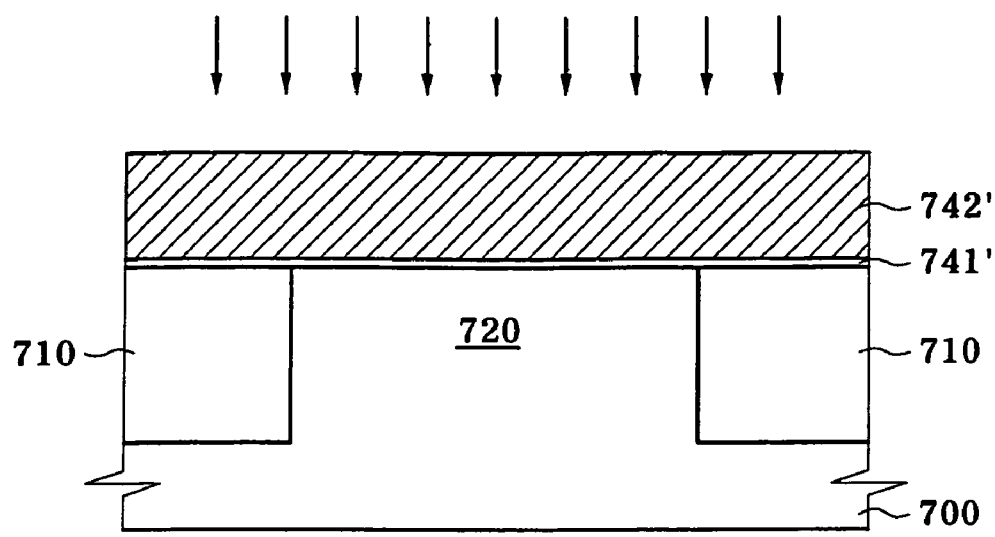
FIGS. 7 and 8 are cross-sectional views illustrating partial steps of a method of manufacturing a semiconductor device of FIG. 6.
Figure 8:
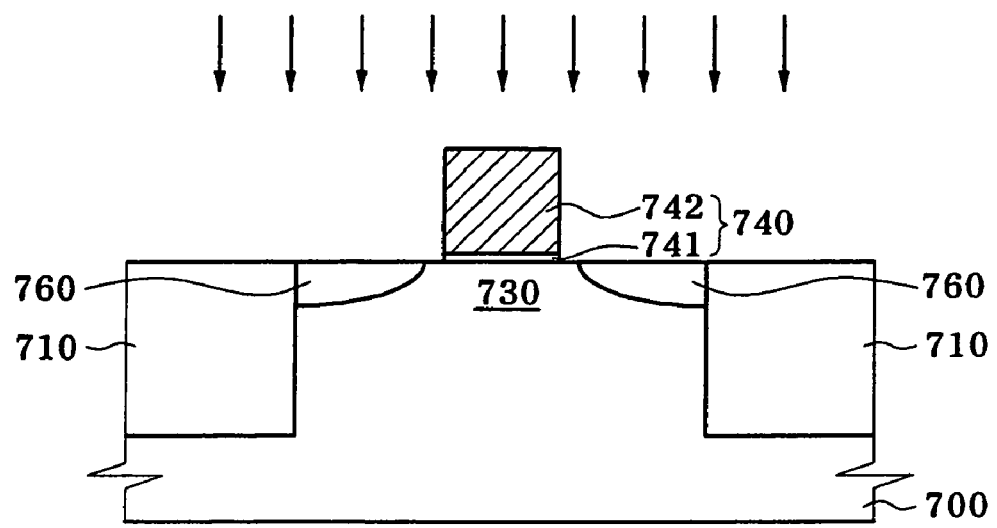

FIG. 6 is a flow chart illustrating a method of manufacturing a semiconductor device via use of gate-through ion implantation in accordance with another embodiment of the present invention. FIGS. 7 and 8 are cross-sectional views illustrating partial steps of a method of manufacturing a semiconductor device of FIG. 6.

Referring now to FIG. 6 in conjunction with FIGS. 7 and 8, isolation films 710 are first formed, thereby defining an active region 720 of a semiconductor substrate 700 (Step 610). Next, a gate insulating film 741' and a gate conductive film 742' are sequentially stacked on the semiconductor substrate 700 (Step 620). Next, as represented by arrows in FIG. 7, ion implantation for formation of wells and ion implantation for control of threshold voltage, as gate-through ion implantation, are carried out on the entire surface of the semiconductor substrate 700 having the gate insulating film 741' and gate conductive film 742' sequentially stacked thereon (Step 630). Next, the gate conductive film 742' and gate insulating film 741' are sequentially patterned to form a gate stack 740 in which gate insulating film patterns 741 and gate conductive film patterns 742 are sequentially stacked (Step 640). Next, as represented by arrows in FIG. 8, junction ion implantation for formation of source/drain regions is carried out by gate-through ion implantation (Step 650).

As apparent from the above description, in the method of manufacturing a semiconductor device via use of a gate-through ion implantation in accordance with the present invention, a gate stack is first formed, and ion implantation for formation of well regions, for control of threshold voltage of channel region and for formation of source/drain regions is then carried out on the entire surface of the semiconductor substrate having the gate stack formed thereon. Therefore, the present invention provides advantages such as no problems associated with changes in concentrations of implanted dopants due to heat treatment upon formation of the gate stack, and reduced numbers of open masks and manufacturing steps, thus enhancing the overall process efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device, comprising:

forming a gate stack over a semiconductor substrate;

performing ion implantation for formation of wells, ion implantation for control of threshold voltage and junction ion implantation for formation of source/drain regions, in cell regions, utilizing a cell-open mask, on the entire surface of the semiconductor substrate having the gate stack formed thereon;

sequentially performing first ion implantation for formation of wells, second ion implantation for control of threshold voltage, and third ion implantation for formation of source/drain regions, in an NMOS region of a peripheral circuit region, utilizing an NMOS-open mask, on the entire surface of the gate stack and the semiconductor substrate within the NMOS region; and sequentially performing fourth ion implantation for formation of wells, fifth ion implantation for control of threshold voltage, and sixth ion implantation for formation of source/drain regions, in a PMOS region of the peripheral circuit region, utilizing a PMOS-open mask, on the entire surface of the gate stack and the semiconductor substrate within the PMOS region.

2. The method according to claim 1, further comprising:

forming gate spacers on side walls of the gate stack after forming the gate stack.

3. The method according to claim 2, comprising carrying out ion implantation for formation of wells, ion implantation for control of threshold voltage and junction ion implantation in the cell regions, ion implantation for formation of wells, ion implantation for control of threshold voltage and junction ion implantation in the NMOS region, and ion implantation for formation of wells, ion implantation for control of threshold voltage and junction ion implantation in the PMOS region after forming the gate spacers.

4. The method according to claim 1, comprising carrying out ion implantation for formation of wells, ion implantation for control of threshold voltage and junction ion implantation, in the cell regions, NMOS region and PMOS region, at an angle of 0 to 20 degrees, an implantation energy of 5 to 2000 KeV and a dose of $1.1 \times 10^{11}$ to $1.0 \times 10^{16}$ ions/cm$^2$.

5. A method of manufacturing a semiconductor device, comprising:

sequentially forming a gate insulating film and a gate conductive film over a semiconductor substrate;

performing first ion implantation for formation of wells on the entire surface of the gate conductive film and the semiconductor substrate;

performing second ion implantation for control of threshold voltage on the entire surface of the gate conductive film and the semiconductor substrate;

performing third ion implantation for formation of source/drain regions on the entire surface of the gate conductive film and the semiconductor substrate;

patterning the gate insulating film and gate conductive film to form a gate stack in which gate insulating film patterns and gate conductive film patterns are sequentially stacked; and performing fourth ion implantation for formation of source/drain regions, on the entire surface of the gate stack and the semiconductor substrate.

* * * * *